US008248181B2

(12) United States Patent
Podell

(10) Patent No.: US 8,248,181 B2
(45) Date of Patent: Aug. 21, 2012

(54) TRANSMISSION-LINE TRANSFORMER

(75) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 301 days.

(21) Appl. No.: 12/787,718

(22) Filed: May 26, 2010

(65) Prior Publication Data

US 2011/0074519 A1 Mar. 31, 2011

Related U.S. Application Data

(60) Provisional application No. 61/247,308, filed on Sep. 30, 2009.

(51) Int. Cl.
*H03H 7/42* (2006.01)
*H01P 3/02* (2006.01)

(52) U.S. Cl. .......................................... 333/26; 333/33

(58) Field of Classification Search .................... 333/25, 333/26, 33, 236, 243
See application file for complete search history.

(56) References Cited

U.S. PATENT DOCUMENTS

| | | | | |
|---|---|---|---|---|
| 3,103,638 | A * | 9/1963 | Greuet | 333/127 |
| 3,237,130 | A | 2/1966 | Cohn | |
| 3,370,257 | A * | 2/1968 | Spierling | 333/33 |
| 3,428,886 | A * | 2/1969 | Kawashima et al. | 333/33 |
| 3,614,676 | A * | 10/1971 | Boelke | 333/26 |
| 4,222,016 | A * | 9/1980 | Stock et al. | 333/24 R |
| 4,554,518 | A * | 11/1985 | Baer | 333/33 |
| 4,825,220 | A | 4/1989 | Edward et al. | |
| 5,008,639 | A | 4/1991 | Pavio | |
| 5,121,090 | A * | 6/1992 | Garuts et al. | 333/124 |
| 5,296,823 | A | 3/1994 | Dietrich | |
| 5,304,959 | A | 4/1994 | Wisherd et al. | |
| 5,697,088 | A | 12/1997 | Gu | |
| 5,977,842 | A | 11/1999 | Brown et al. | |
| 5,982,252 | A | 11/1999 | Werlau | |
| 6,130,588 | A * | 10/2000 | Gallivan et al. | 333/25 |
| 6,150,897 | A * | 11/2000 | Nishikawa et al. | 333/26 |
| 6,285,273 | B1 | 9/2001 | Morikawa | |
| 6,294,965 | B1 | 9/2001 | Merrill et al. | |
| 6,750,752 | B2 | 6/2004 | Werlau | |
| 6,819,200 | B2 | 11/2004 | Zhao et al. | |
| 6,914,512 | B2 | 7/2005 | Park et al. | |
| 6,982,609 | B1 | 1/2006 | McKay et al. | |
| 7,068,122 | B2 * | 6/2006 | Weng et al. | 333/26 |
| 7,274,267 | B2 | 9/2007 | Saitou et al. | |
| 7,692,512 | B2 * | 4/2010 | Podell | 333/26 |
| 7,839,232 | B2 * | 11/2010 | London | 333/26 |

OTHER PUBLICATIONS

The Southgate Amateur Radio Club, byline given as "G8MNY"; "Techtip: Coax Balun" web page; downloaded from www.southgatearc.org on Aug. 3, 2007; 2 pages.

(Continued)

*Primary Examiner* — Dean O Takaoka
(74) *Attorney, Agent, or Firm* — Kolisch Hartwell, P.C.

(57) ABSTRACT

An example of a transmission-line transformer may include a transmission-line assembly and a balun assembly. The transmission-line assembly may include first and second conductors forming at least first and second transmission-line sections. The transmission-line assembly may provide a signal path through the first conductor and second conductor in series to a circuit ground. Balanced lines of the balun assembly may be connected to respective intermediate points on the first and second conductors between the first and second transmission-line sections. The transmission-line transformer may provide a signal path between a first end of the first conductor of the transmission-line assembly and the unbalanced line of the balun assembly.

20 Claims, 5 Drawing Sheets

OTHER PUBLICATIONS

Microwave Encyclopedia—Microwaves101.com; "Baluns" web page; http://www.microwaves101.com/encyclopedia/baluns.cfm; updated Nov. 28, 2006 and downloaded Aug. 1, 2007; 3 pages.
H.T. Kim, et al; "Ultra-wideband uniplanar MMIC balun using field transformations"; Electronics Letters vol. 42 No. 6; Mar. 16, 2006; 2 pages.
Nai-Shuo Cheng et al; "A 120-W X-Band Spatially Combined Solid-State Amplifier"; IEEE Transactions on Microwave Theory and Techniques vol. 47 No. 12 pages 2557 through 2561; Dec. 1999; 5 pages.
Angelos Alexanian; "Planar and Distributed Spatial Power Combiners" doctoral dissertation; University of California Santa Barbara; Jun. 1997; 119 pages.
Hongming An, et al; "A 50:1 Bandwidth Cost-Effective Coupler with Sliced Coaxial Cable"; IEEE MTT-S Digest, 1996; 4 pages.
Paul Horowitz et al.; "Stubs, baluns, and transformers"; The Art of Electronics section 13.10, pp. 881 through 882, Second Edition; Copyright 1989 Cambridge University Press; 4 pages.
Valerie Illingworth, editor; Definition of the word "balun"; The Penguin Dictionary of Electronics p. 30, Second Edition; Copyright 1988 Penguin Books; 2 pages.
Kenneth J. Russell; "Microwave Power Combining Techniques"; IEEE Transactions on Microwave Theory and Techniques vol. MTT-27 No. 5 pp. 472 through 478; May 1979; 7 pages.
C.W. Gerst; "Electrically Short 90° Couplers Utilizing Lumped Capacitors"; Microwave Symposium Digest, G-MTT International vol. 67, Issue 1, pp. 58 through 62; May 1967; 5 pages.
G.D. Monteath; "Coupled Transmission Lines as Symmetrical Directional Couplers"; Proc. IEE, vol. 102, Part B, No. 3, pp. 383 through 392; May 1955; 10 pages.
Rogers Corporation; "RT/duroid 5870/5880 High Frequency Laminates" data sheet; copyright 1989 through 2006 Rogers Corporation (Revised Nov. 2006); 2 pages.
Chris Trask; "A Tutorial on Transmission Line Transformers"; Sonoran Radio Research, Tempe, Arizona; Revised Aug. 14, 2005; seven pages
Jerry Sevick; "A Simplified Analysis of the Broadband Transmission Line Transformer"; High Frequency Electronics; Feb. 2004; four pages

* cited by examiner

TRANSMISSION-LINE TRANSFORMER

RELATED APPLICATIONS

This application claims the benefit of U.S. Provisional Application No. 61/247,308, filed Sep. 30, 2009, and incorporated herein by reference in its entirety for all purposes.

BACKGROUND

For certain applications, there is a need for a broadband, high power communication system. For example, in military applications a broad bandwidth is required for secure spread spectrum communication and high power is required for long range. High power broadband communication systems require high power broadband antennas. Often these antennas have an input impedance that does not match the desired transmitter or receiver with which it is used. In such circumstances, impedance transformers can be used to transform the impedance of the antenna to the impedance of the transmitter or receiver.

Transmission-line transformers may be used for matching networks for antennas and amplifiers operating at radio frequencies, such as frequencies in the HF and VHF bands. They are also known for having low losses, which makes them especially useful in high power circuits. Transmission-line transformers may be made using various structures, such as parallel wires, coaxial cables, or twisted wire pairs. In the case of using coaxial-cable transmission lines having the correct characteristic impedance for the transmission-line transformer, the theoretical high frequency bandwidth limit is reached when the cable length comes into the order of a half wavelength (λ/2). By introducing magnetic materials such as powdered iron or ferrite to the transmission-line transformer, both the low frequency limit and the high frequency limit may be improved.

BRIEF SUMMARY

An example of a transmission-line transformer may include a transmission-line assembly and a balun assembly. The transmission-line assembly may include first and second conductors forming at least first and second transmission-line sections. A second end of the first conductor may be connected to a first end of the second conductor. The second end of the second conductor may be connected to a circuit ground. The transmission-line assembly may form a signal path between the first end of the first conductor and the circuit ground at the second end of the second conductor.

The balun assembly may have first and second balanced lines and an unbalanced line. The first balanced line may be connected to an intermediate point on the first conductor between the first and second transmission-line sections. The second balanced line may be connected to an intermediate point on the second conductor between the first and second transmission-line sections. The transmission-line transformer may provide a signal path between the first end of the first conductor of the transmission-line assembly and the unbalanced line of the balun assembly.

Another example of a transmission-line transformer may include first, second and third coupled sections. Each coupled section may have first and second inductively coupled conductors. First ends of the first conductors of the first, second and third coupled sections may be connected together. First ends of the second conductors of the first, second and third coupled sections also may be connected together.

The second end of the second conductor of the first coupled section may be connected to the second end of the first conductor of the second coupled section. The second ends of the second conductors of the second and third coupled sections may be connected to a circuit ground. A signal may be conducted through the transmission-line transformer between the second end of the first conductor of the first coupled section and the second end of the first conductor of the third coupled section.

DETAILED DESCRIPTION

Figure 1:
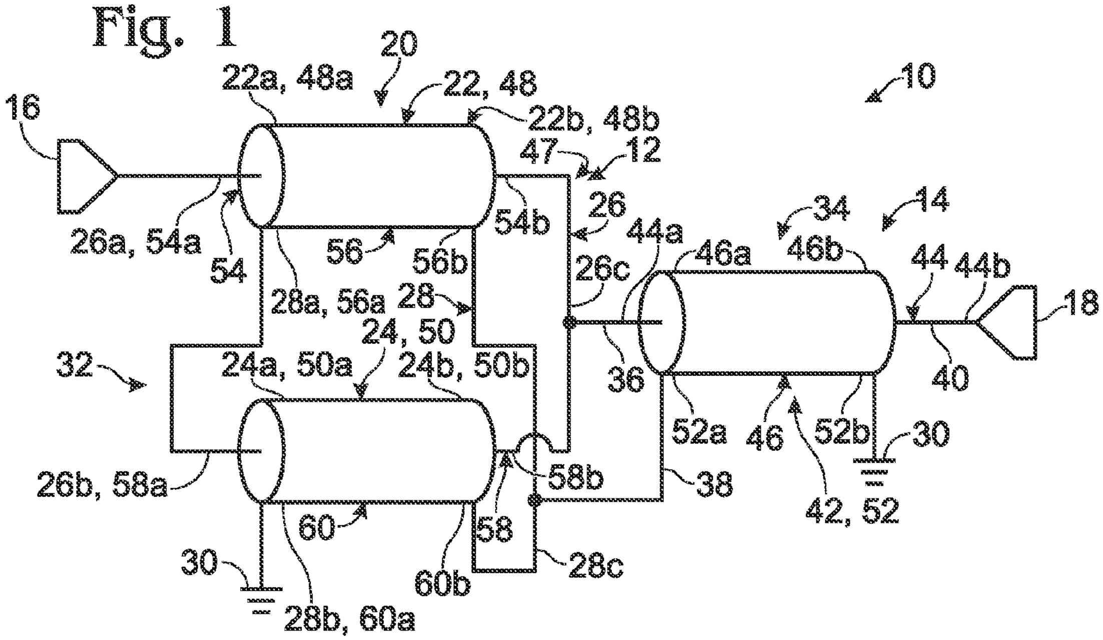
FIG. 1 is a schematic diagram showing an example of an transmission-line transformer with a balun.

A first example of a transmission-line transformer is shown generally at 10 in FIG. 1. In this example, transmission-line transformer 10 includes a transmission-line assembly 12 and a balun assembly 14 extending between a first port 16 and a second port 18. As used in this description, ports are places on conductors where variables or characteristics of a circuit may be observed or measured. Ports may or may not be places of access to the circuit where energy may be supplied (input) or withdrawn (output), depending on the particular structure and application of the circuit. Either one of ports 16 and 18 may be an input port and the other an output port, depending on the particular application.

Transmission-line assembly 12 may include a transmission line 20 that may include a plurality of transmission-line sections, such as transmission-line sections 22 and 24. Although represented as separate sections of coaxial transmission lines, the sections may be formed as a continuous transmission line, and may be formed of other structures, such as parallel wires and twisted pairs of wires. As separate transmission-line sections, each transmission-line section also may be considered a separate transmission line. In this example, transmission-line section 22 has a first end **22*a* and a second, opposite end 22*b*. Similarly, transmission-line section 24 has first and second ends 24*a* and 24*b***. The transmission-line sections may be of any length appropriate in the particular application used. A length that is a quarter wavelength of a design frequency of use, or odd multiples of a quarter wavelength may be preferred when the transmission-line transformer is used for impedance transformation.

Transmission line 20 includes a first conductor 26 extending from a first end **26*a*, associated with transmission-line-section end 22*a*, serially through first and second transmission-line sections 22 and 24 to a second end 26*b*, associated with transmission-line-section end 24*b*. Conductor 26 forms the center conductor of the coaxial transmission line. A second conductor 28 extends from a first end 28*a*, associated with transmission-line-section end 22*a*, serially through transmission-line sections 22 and 24 to a second end 28***b*, associated with transmission-line-section end 24*b*, as the outer or shield conductor of the coaxial transmission line. Conductor end 26*a* forms or is connected to port 16. Conductor end 26*b* is connected to conductor end 28*a*. Conductor end 28*b* is connected to a circuit ground 30. It is seen that an electrical current or continuous signal path 32 extends from port 16 to circuit ground through conductors 26 and 28. In this example, the conductors form a signal path having what may be considered to be two loops through the transmission-line sections.

Balun assembly 14 may include one or more baluns, such as a balun 34 coupling transmission-line assembly 12 to port 18. A balun may be a coupling device that converts an unbalanced source to a balanced one, and vice versa. Sometimes a balun is made with nearly complete isolation between the balanced terminals and ground. Sometimes a balun is made with each balanced terminal referenced to ground, but with equal and opposite voltages appearing at these terminals. In one case, the unbalanced voltage encounters high impedance to ground, making unbalanced current flow difficult, while in the other, any unbalanced current encounters a short circuit to ground, minimizing the voltage that enters the balanced circuit. Microwave baluns can be either of these types, or even a mixture of the two. In any case, one could connect 2 equal unbalanced loads to the 2 balanced terminals, with their ground terminals connected together to ground. Ideally, the unbalanced signal input to the balun would be equally distributed to the two unbalanced loads. Thus, a balun may be used as a power divider or combiner, where two unbalanced loads or sources connected to the balanced terminals would be operating 180-degrees out of phase.

In this example, balun 34 may include balanced lines 36 and 38 that may be respectively connected to intermediate points 26*c* and 28*c* on conductors 26 and 28. Intermediate points 26*c* and 28*c* are seen to be unconnected to circuit ground, so the voltages on these conductors is determined at least in part by the particular signals that transmission-line transformer 10 conducts. Balun 34 has a corresponding unbalanced line 40 forming or connected to port 18. Generally, balun 34 includes a transmission line or transmission-line section 42, shown as a coaxial transmission line, having inductively coupled center conductor 44 and shield or outer conductor 46. A first end 44*a* of conductor 44 corresponds to balanced line 36 and is connected to conductor intermediate point 26*c* and a second end 44*b* corresponds to unbalanced line 40 and is connected to or forms port 18. Outer conductor 46 has a first end 46*a* corresponding to balanced line 38 and is connected to conductor intermediate point 28*c* and a second end 46*b* is connected to circuit ground 30. Transmission-line transformer 10 may provide one or more signal paths 47 between port 16 (first end 26*a* of the first conductor 26 of transmission-line assembly 12) and port 18 (unbalanced line 40 of balun assembly 14).

Transmission-line transformer 10 may also be considered to be made of interconnected inductively coupled sections of conductors. In particular, transmission-line sections 22, 24, and 42 are examples of respective coupled sections 48, 50 and 52. The coupled sections have respective opposite ends 48*a*, 48*b*, ends 50*a*, 50*b*, and ends 52*a*, 52*b*. The coupled sections may also be considered to have respective inductively coupled conductors. For example, coupled section 48 may include first and second conductors 54 and 56 forming corresponding sections of conductors 26 and 28, with respective ends 54*a*, 54*b* and ends 56*a*, 56*b*; and coupled section 50 may include first and second conductors 58 and 60 also forming corresponding sections of conductors 26 and 28, with respective ends 58*a*, 58*b* and ends 60*a*, 60*b*. Coupled section 52 may include previously described first and second conductors 44 and 46. It is seen that in the example shown in FIG. 1, conductor ends 44*a*, 54*b*, and 58*b* are connected together, and conductor ends 46*a*, 56*b*, and 60*b* are also connected together. Corresponding to the description of conductors 26, 28, conductor end 58*a* is connected to conductor end 56*a*, and conductor end 60*a* is connected to circuit ground 30.

Transmission-line transformer 10 may be used for impedance matching. By providing transmission line sections 22, 24, and 42 with different characteristic impedances, a wide range of impedances may be accommodated. For example, when transmission line sections 22 and 24, and thereby transmission line 20, have a characteristic impedance of 50 ohms and transmission-line section 42 has a characteristic impedance of 25 ohms, transmission-line transformer 10 provides 4:1 impedance transformation, and may be used to couple a 100-ohm circuit on port 16 to a 25-ohm circuit on port 18.

Figure 2:
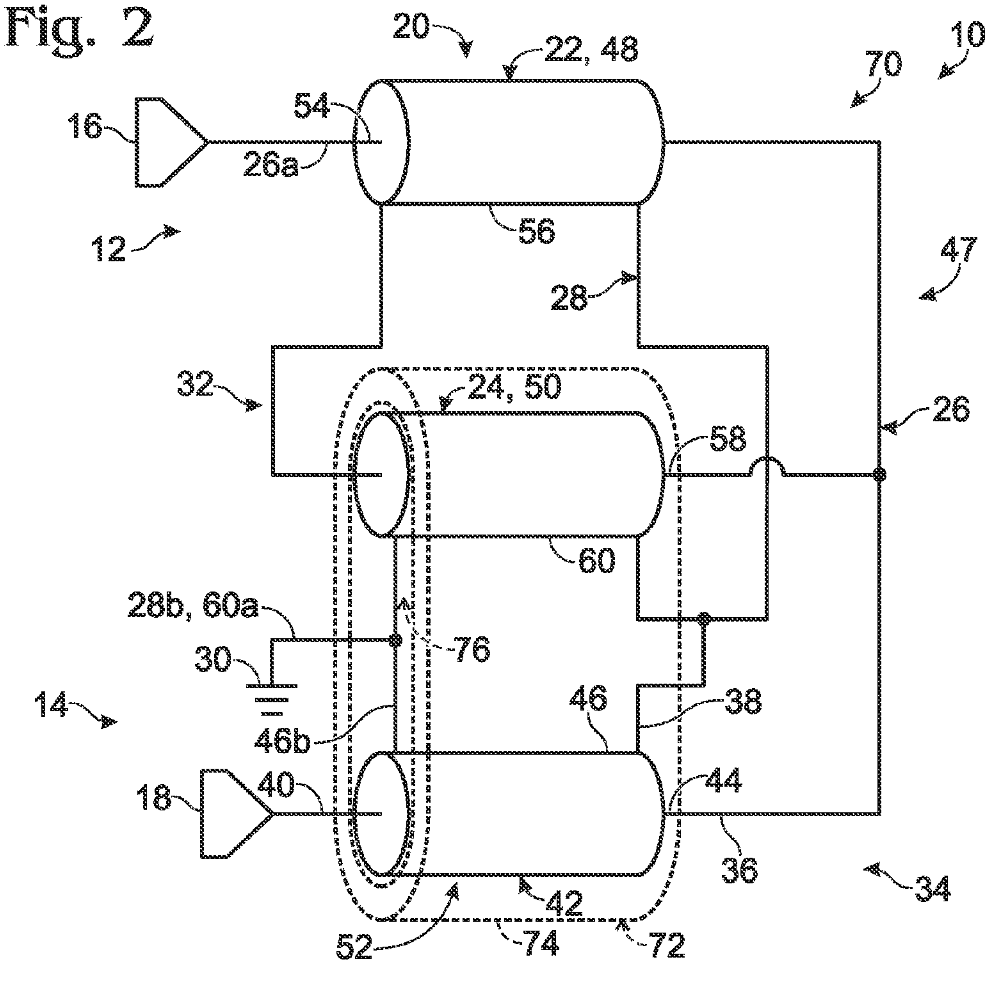
FIG. 2 is a schematic diagram showing a further example of a transmission-line transformer with a balun.

FIG. 2 shows at 70 an example of a modification of transmission-line transformer 10. Elements also shown in FIG. 1 have the same reference numbers as those in FIG. 1, and the description in FIG. 1 applies as well to FIG. 2. For ease of illustration all of the applicable reference numbers from FIG. 1 are not shown in FIG. 2. The reader is referred to the description of FIG. 1 as needed for identification of reference numbers not included in FIG. 2. This convention is used in subsequent drawings as well.

In transmission-line transformer 70, balun 34 of assembly 14 has in effect been folded back so that it is positioned proximate to transmission line section 24 of transmission-line assembly 12. In this configuration conductor end 46*b* may be coupled to a shared connection to circuit ground 30 with conductor end 28*b* (coupled-section conductor end 60*a*). Unbalanced line 40 is also aligned with center conductor end 26*a*, positioning ports 16 and 18 on the same side of the transmission-line transformer.

With balun 34 proximate to and physically parallel to transmission-line section 24, it may be advantageous to position them with a shared magnetic material 72 shown in dashed lines as a magnetic loop 74 having an opening 76 through which both extend. The material forming a loop may have other shapes. In other applications, magnetic material 72 may be in other forms, such as a toroidal magnetic core with coaxial transmission line section 24 and coaxial transmission line 42 wrapped around the magnetic core. The magnetic fields produced by coaxial outer conductors 28 and 46 thereby flow in the shared magnetic material.

As discussed above for transmission-line transformer 10, as one example of impedance transformation, transmission line sections 22 and 24, and thereby transmission line 20, may have characteristic impedances of 50 ohms and transmission-line section 42 may have a characteristic impedance of 25 ohms. In this configuration, transmission-line transformer 10 may be used to couple a 100-ohm circuit on port 16 to a 25-ohm circuit on port 18.

Figure 3:
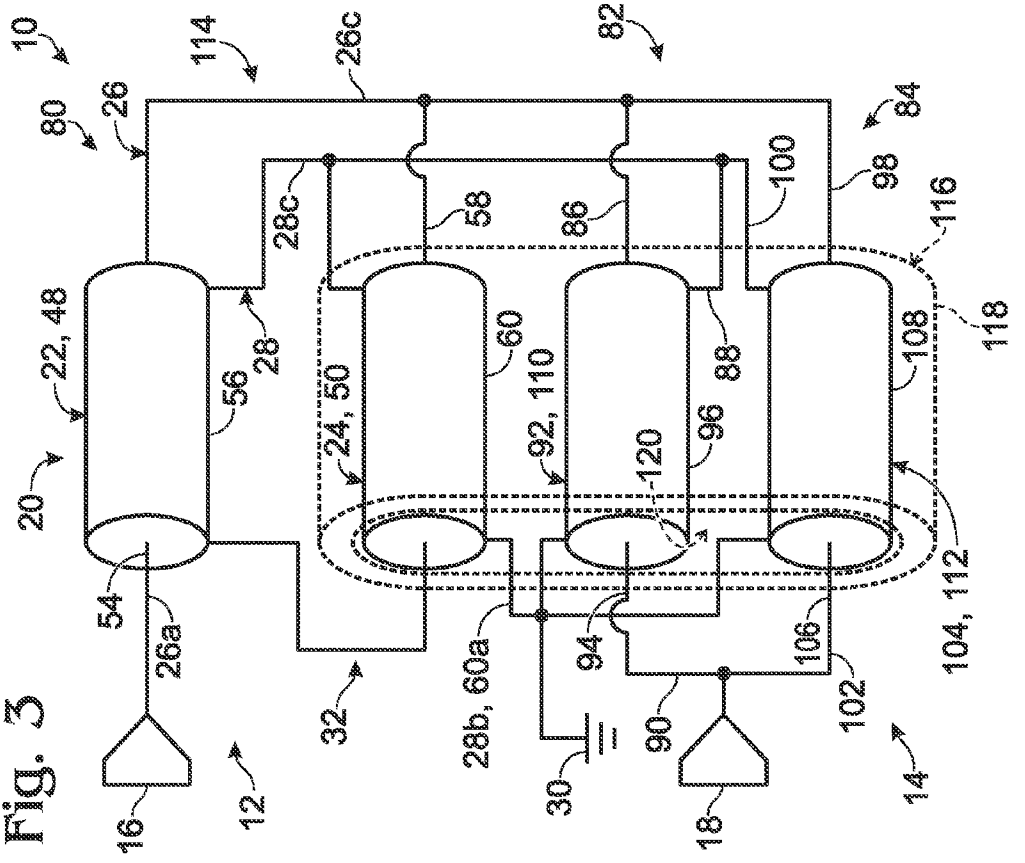
FIG. 3 is a schematic diagram showing a further example of a transmission-line transformer with a balun.

FIG. 3 depicts generally at 80 yet another example of a transmission-line transformer 10. Again, reference numbers used in the previous figures that apply to transmission-line transformer 80 are repeated. Transmission-line transformer 80 may include a transmission-line assembly 12 and a balun assembly 14. Transmission-line transformer 12 includes transmission line 20 having coaxial transmission-line sections 22 and 24 with inductively coupled conductors 26 and 28 forming a signal path 32 as described previously for transmission-line assembly 12.

In this example, balun assembly 14 includes first and second baluns 82 and 84 connected electrically in parallel. Balun

82 may include balanced lines 86 and 88 that may be respectively connected to intermediate points 26*c* and 28*c* on conductors 26 and 28. Intermediate points 26*c* and 28*c* are seen to be unconnected to circuit ground, so the voltages on these conductors is determined at least in part by the particular signals that transmission-line transformer 10 conducts. Balun 82 has a corresponding unbalanced line 90 that forms port 18 or is connected to port 18. Generally, balun 82 includes a transmission line or transmission-line section 92, shown as a coaxial transmission line, having inductively coupled center conductor 94 and shield or outer conductor 96. A first end 94*a* of conductor 94 corresponding to balanced line 86 is connected to conductor intermediate point 26*c* and a second end 94*b* corresponding to unbalanced line 90 is connected to port 18 or forms port 18. Outer conductor 96 has a first end 96*a* corresponding to balanced line 88 connected to conductor intermediate point 28*c* and a second end 96*b* connected to circuit ground 30.

Balun 84 may include balanced lines 98 and 100 that also may be respectively connected to intermediate points 26*c* and 28*c* on conductors 26 and 28. Balun 84 has an unbalanced line 102 corresponding to conductor end 94*b* that thereby also forms port 18 or is connected to port 18, with unbalanced line 90. Balun 84 includes a transmission line or transmission-line section 104, shown as a coaxial transmission line, having inductively coupled center conductor 106 and shield or outer conductor 108. A first end 106*a* of conductor 106 corresponding to balanced line 98 is connected to conductor intermediate point 26*c*. A second end 106*b* corresponding to unbalanced line 102 is connected to port 18 or forms port 18 with conductor second end 94*b*. Outer conductor 108 has a first end 108*a* corresponding to balanced line 100 connected to conductor intermediate point 28*c* and a second end 108*b* connected to circuit ground 30 with conductor end 96*b*.

Transmission-line sections 92 and 104 may also be considered coupled sections 110 and 112 with associated conductors being inductively coupled. Transmission-line transformer 80 may provide one or more signal paths, represented generally at 114, between ports 16 and 18.

Transmission-line section 24 of transmission-line assembly 12 and transmission-line sections 92 and 104 may be positioned relative to a shared magnetic material 116, shown as a magnetic loop 118. In this example, the transmission-line sections extend through an opening 120 extending through magnetic loop 118. The magnetic fields produced by coaxial outer conductors 28, 96 and 108 thereby flow in the shared magnetic material.

When used for coupling a 100-ohm circuit on port 16 to a 25-ohm circuit on port 18, each of the transmission line segments may have characteristic impedances of 50 ohms. Since baluns 82 and 84 are connected in electrical parallel configuration, the combination of the two baluns provides a combined effective impedance of 25 ohms at port 18.

Figure 4:
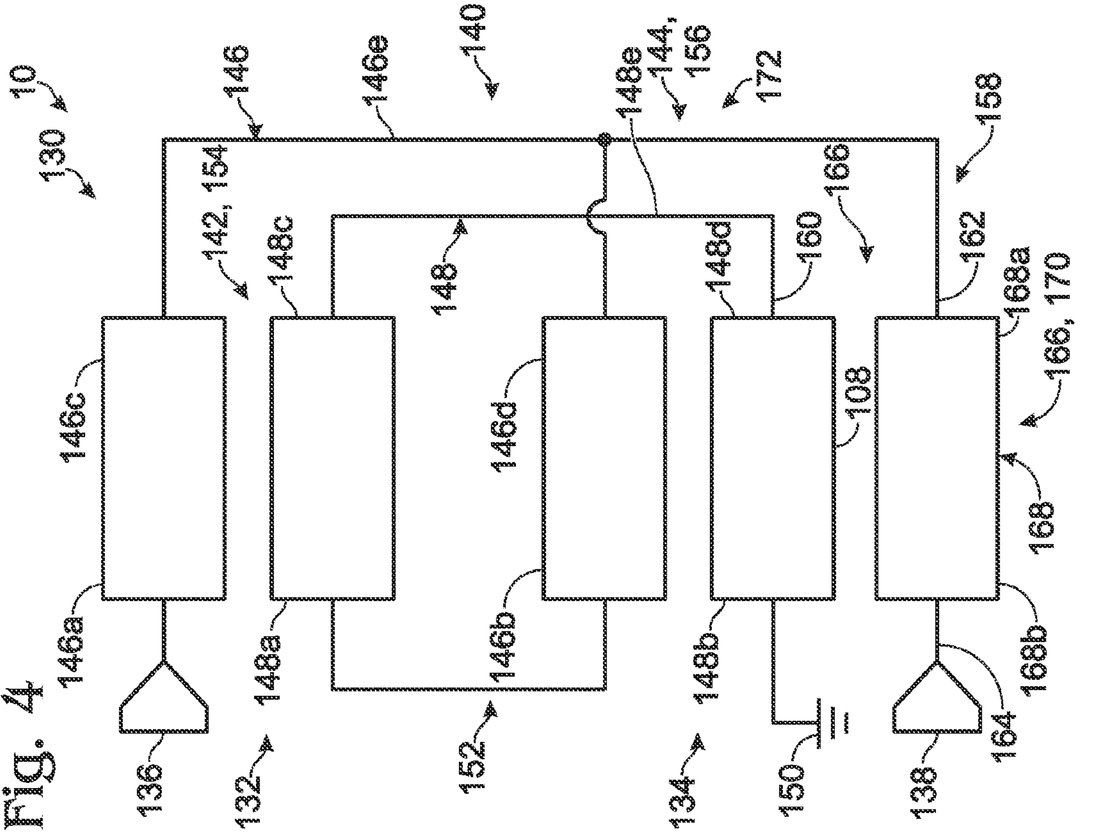
FIG. 4 is a schematic diagram showing a further example of a transmission-line transformer with a balun.

As mentioned, the coaxial transmission lines in transmission-line transformers 10 shown in FIGS. 1-3 may also be made with coupled wires or other conductors. For example, FIG. 4 shows a transmission-line transformer 130 corresponding to transmission-line transformer 70 shown in FIG. 2. Transmission-line transformer 130 includes a plurality of coupled sections forming a transmission-line assembly 132 and a balun assembly 134 extending between a first port 136 and a second port 138. Each coupled section includes inductively coupled conductors. In this example, the conductors are coplanar, although the transmission-line transformer may be realized with other conductor configurations.

Transmission-line assembly 132 may include a transmission line 140 that may include a plurality of transmission-line sections, such as transmission-line sections 142 and 144. Transmission line 140 includes a first conductor 146 extending from a first end 146*a* serially through first and second transmission-line sections 142 and 144 to a second end 146*b*. A second conductor 148 extends serially from a first end 148*a* through transmission-line sections 142 and 144 to a second end 148*b*. Conductor end 146*a* forms or is connected to port 136. Conductor end 146*b* is connected to conductor end 148*a*. Conductor end 148*b* is connected to a circuit ground 150. It is seen that a continuous signal path 152 extends from port 136 to circuit ground through conductors 146 and 148. In this example, as in the previous examples, conductors 146 and 148 form a signal path having what may be considered to be two loops through transmission-line sections 142 and 144.

Transmission-line sections 142 and 144 are also coupled sections 154 and 156 of inductively coupled portions of conductors 146 and 148. Conductor 146 has ends 146*a* and 146*c* in coupled section 154 and ends 146*d* and 146*b* in coupled section 156. Similarly, conductor 148 has ends 148*a* and 148*c* in coupled section 154 and ends 148*d* and 148*b* in coupled section 156.

Balun assembly 134 may include one or more baluns, such as a balun 158 coupling transmission-line assembly 132 to port 138. In this example, balun 158 may include balanced lines 160 and 162 that may be respectively connected to intermediate points 146*e* and 148*e* on conductors 146 and 148. Intermediate points 146*e* and 148*e* are seen to be unconnected to circuit ground, so the voltage on these conductors is determined at least in part by the particular signals that transmission-line transformer 10 conducts. Balun 158 has a corresponding unbalanced line 164 forming or connected to port 138.

Generally, balun 158 includes a transmission line or transmission-line section 166, having a conductor 168 inductively coupled to the portion of conductor 148 in coupled section 156. Conductors 168 and 148 thereby form another coupled section 170. Conductor 148 is thus shared by coupled sections 156 and 170, with conductors 146 and 168 disposed on opposite sides of conductor 148. A first end 168*a* of conductor 168 corresponding to balanced line 162 is connected to conductor intermediate point 146*e* and a second end 168*b* corresponding to unbalanced line 164 is connected to or forms port 138. Conductor end 148*d* corresponds to balanced line 160. Transmission-line transformer 132 may provide one or more signal paths 172 between port 136 (first end 146*a* of the first conductor 146 of transmission-line assembly 132) and port 138 (unbalanced line 164 of balun assembly 134).

Transmission-line transformer 130 may be used for impedance matching. By providing coupled sections 154, 156, and 170 with different characteristic impedances, a wide range of impedances may be accommodated. For example, when transmission line sections 154 and 156, and thereby transmission line 140, have a characteristic impedance of 50 ohms and transmission-line section 170 has a characteristic impedance of 25 ohms, transmission-line transformer 130 may be used to couple a 100-ohm circuit on port 136 to a 25-ohm circuit on port 138.

Figure 5:
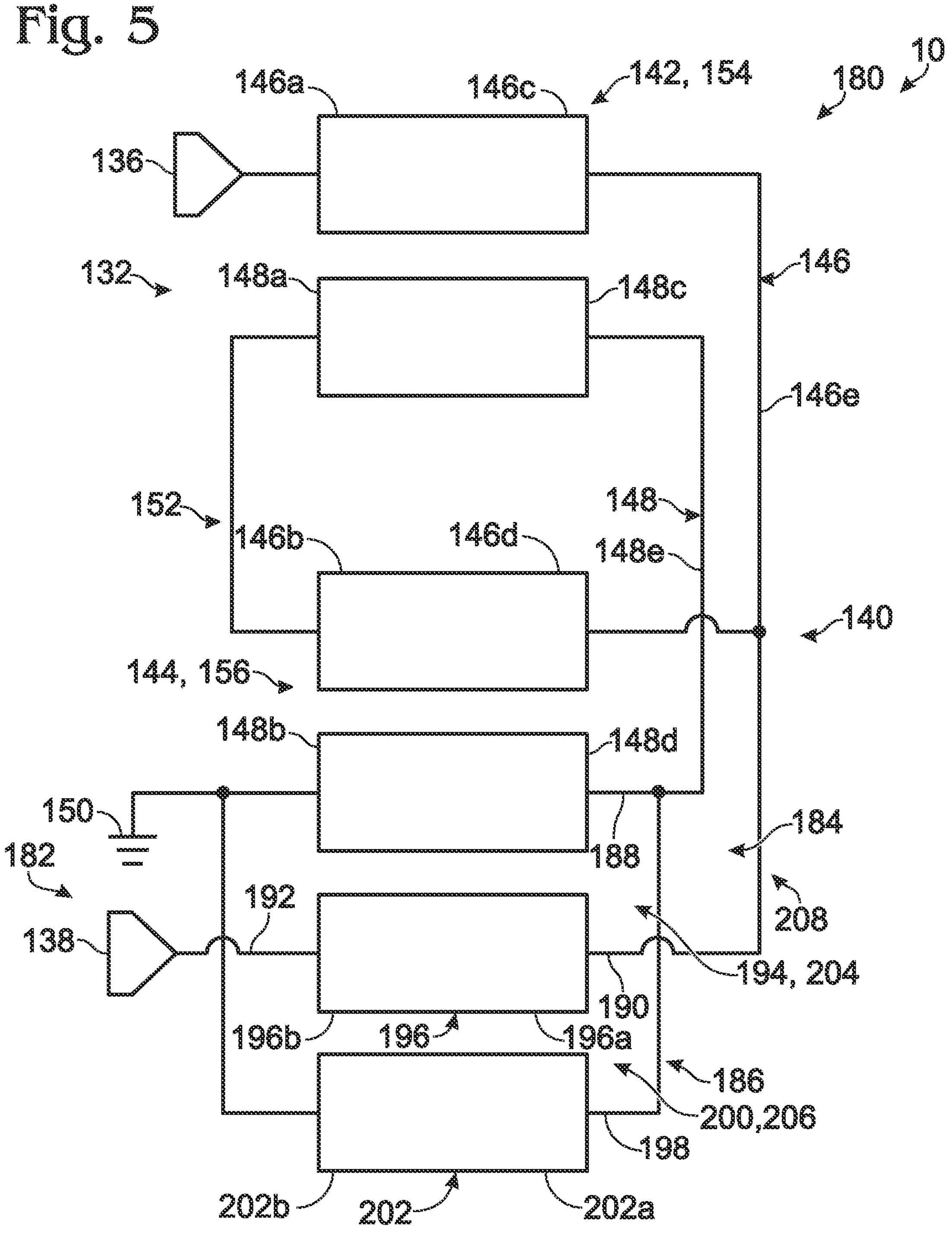
FIG. 5 is a schematic diagram showing a further example of a transmission-line transformer with a balun.

FIG. 5 shows generally at 180 a transmission-line transformer that is an example of a transmission-line transformer 10. Transmission-line transformer 180 is similar to transmission-line transformer 130, and is also formed of planar conductors forming coupled sections. Features that are the same as those for transmission-line transformer 130 are given the same reference numbers. Accordingly, transmission-line transformer 180 is seen to include transmission-line assembly 132 and a balun assembly 182 coupling port 136 to port 138. Transmission-line transformer 132 includes transmission line 140 formed of transmission-line sections 142 and 144. Transmission line 140 is formed by conductors 146 and 148 having respective transmission-line section ends 146*a*-146*d* and 148*a*-148*d*. Further, conductors 146 and 148 form coupled sections 154 and 156 that are interconnected to make a signal path 152 from port 136 to circuit ground 150.

In this example, balun assembly 182 includes first and second baluns 184 and 186 connected electrically in parallel. Balun 184 may include balanced lines 188 and 190 that may be respectively connected to intermediate points 146*e* and 148*e* on conductors 146 and 148. Intermediate points 146*e* and 148*e* are seen to be unconnected to circuit ground, so the voltage on these conductors is determined at least in part by the particular signals that transmission-line transformer 180 conducts. Balun 182 has a corresponding unbalanced line 192 that forms port 138 or is connected to port 138. Generally, balun 184 includes a transmission line or transmission-line section 194, shown as parallel wires, having a conductor 196 inductively coupled to the portion of conductor 148 in coupled section 156, similar to the configuration of balun 158. A first end 196*a* of conductor 196 corresponding to balanced line 190 is connected to conductor intermediate point 146*e* and a second end 196*b* corresponding to unbalanced line 192 is connected to port 138 or forms port 138.

Balun 186 may include balanced lines 190 and 198, with line 198 being connected to intermediate point 148*e* on conductor 148. Unbalanced line 192 is the unbalanced line for balun 186. Balun 186 includes a transmission line or transmission-line section 200 having a conductor 202 inductively coupled to conductor 196. A first end 202*a* of conductor 202 corresponding to balanced line 198 is connected to conductor intermediate point 148*e* and a second end 202*b* is connected to circuit ground 150 with conductor end 148*b*.

Transmission-line sections 194 and 200 are also coupled sections 204 and 206. Transmission-line transformer 180 may provide one or more signal paths, represented generally at 208 between ports 136 and 138. In some examples, transmission-line sections 142, 144, 194, and 200 have the same characteristic impedances, such as 50 ohms. Since baluns 184 and 186 are connected in electrical parallel configuration, the combination of the two baluns provides a combined effective impedance of 25 ohms at port 138. Transmission-line transformer 180 may thereby be used to couple a 100-ohm circuit on port 138 to a 25-ohm circuit on port 136.

Figure 7:
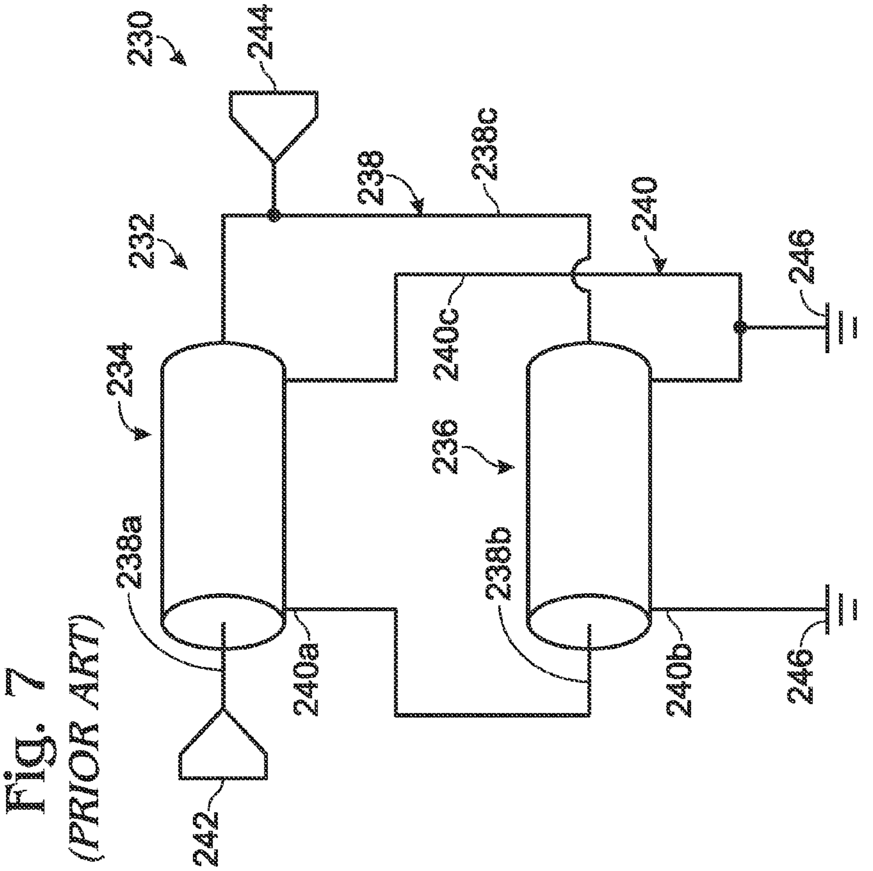
Fig. 7 (PRIOR ART)
FIG. 7 is a schematic diagram of another prior art transformer.
Figure 6:
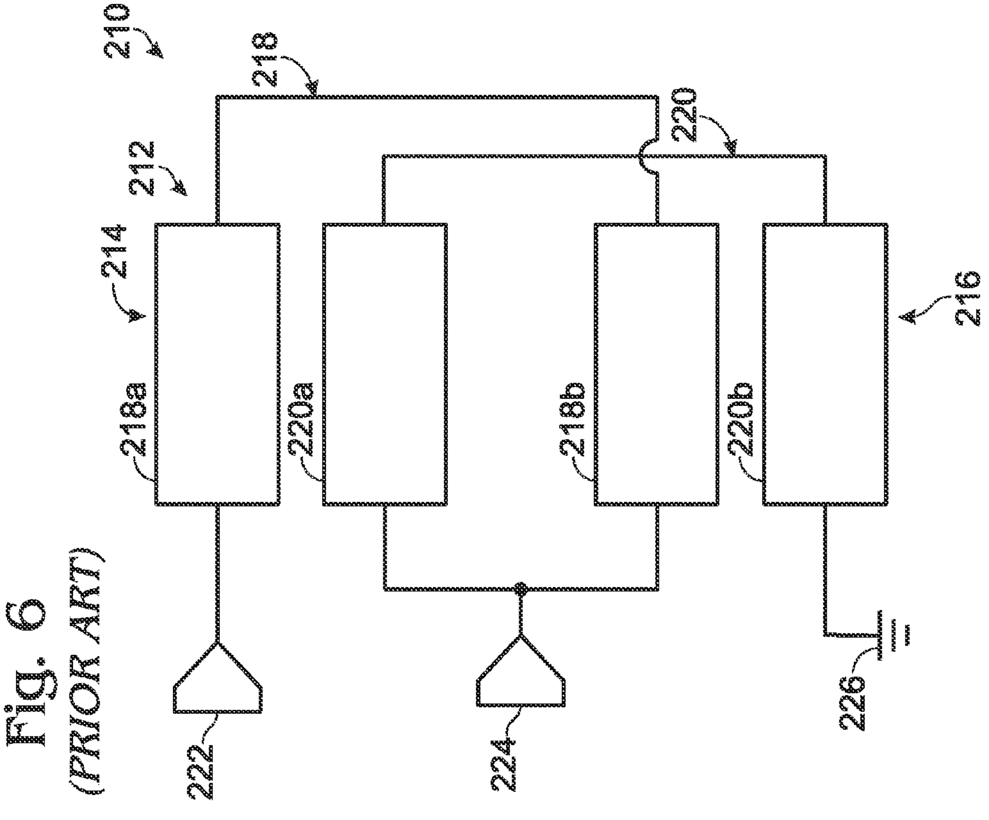
Fig. 6 (PRIOR ART)
FIG. 6 is a schematic diagram of a prior art transformer.

For reference, FIGS. 6 and 7 show two examples of prior-art transmission-line transformers. Referring to FIG. 6, a transmission-line transformer 210 includes a transmission line 212 formed as transmission-line sections 214 and 216. Transmission line 212 includes a first conductor 218 extending from a first end 218*a* serially through first and second transmission-line sections 214 and 216 to a second end 218*b*. A second conductor 220 extends serially from a first end 220*a* through transmission-line sections 214 and 216 to a second end 220*b*. Conductor end 218*a* is connected to a first port 222. A second port 224 is connected to conductor end 218*b* and conductor end 220*a*. Conductor end 220*b* is connected to a circuit ground 226.

Conductors 218 and 220 are inductively coupled in transmission-line sections 214 and 216. If these coupled sections have 50-ohm impedance, the circuit provides impedance transformation between a 100-ohm circuit on port 222 to a 25-ohm circuit on port 224.

FIG. 7 illustrates a further prior-art transmission-line transformer 230. Transmission-line transformer 230 includes a coaxial transmission line 232 formed as coaxial transmission-line sections 234 and 236. Transmission line 232 includes a first, center conductor 238 extending from a first end 238*a* serially through first and second transmission-line sections 234 and 236 to a second end 238*b*. A second, outer conductor 240 extends serially from a first end 240*a* through transmission-line sections 234 and 236 to a second end 240*b*. Conductor end 238*a* is connected to a first port 242. Conductor end 238*b* is connected to conductor end 240*a*. An intermediate point 238*c* on conductor 238 between transmission-line sections 234 and 236 is connected to a second port 244. An intermediate point 240*c* on conductor 240 is connected to a circuit ground 246. Conductor end 240*b* is also connected to circuit ground 246.

Conductors 238 and 240 are inductively coupled in transmission-line sections 234 and 236. If these coupled sections have 50-ohm impedance, the circuit provides impedance transformation between a 100-ohm circuit on port 242 to a 25-ohm circuit on port 244.

Figure 8:
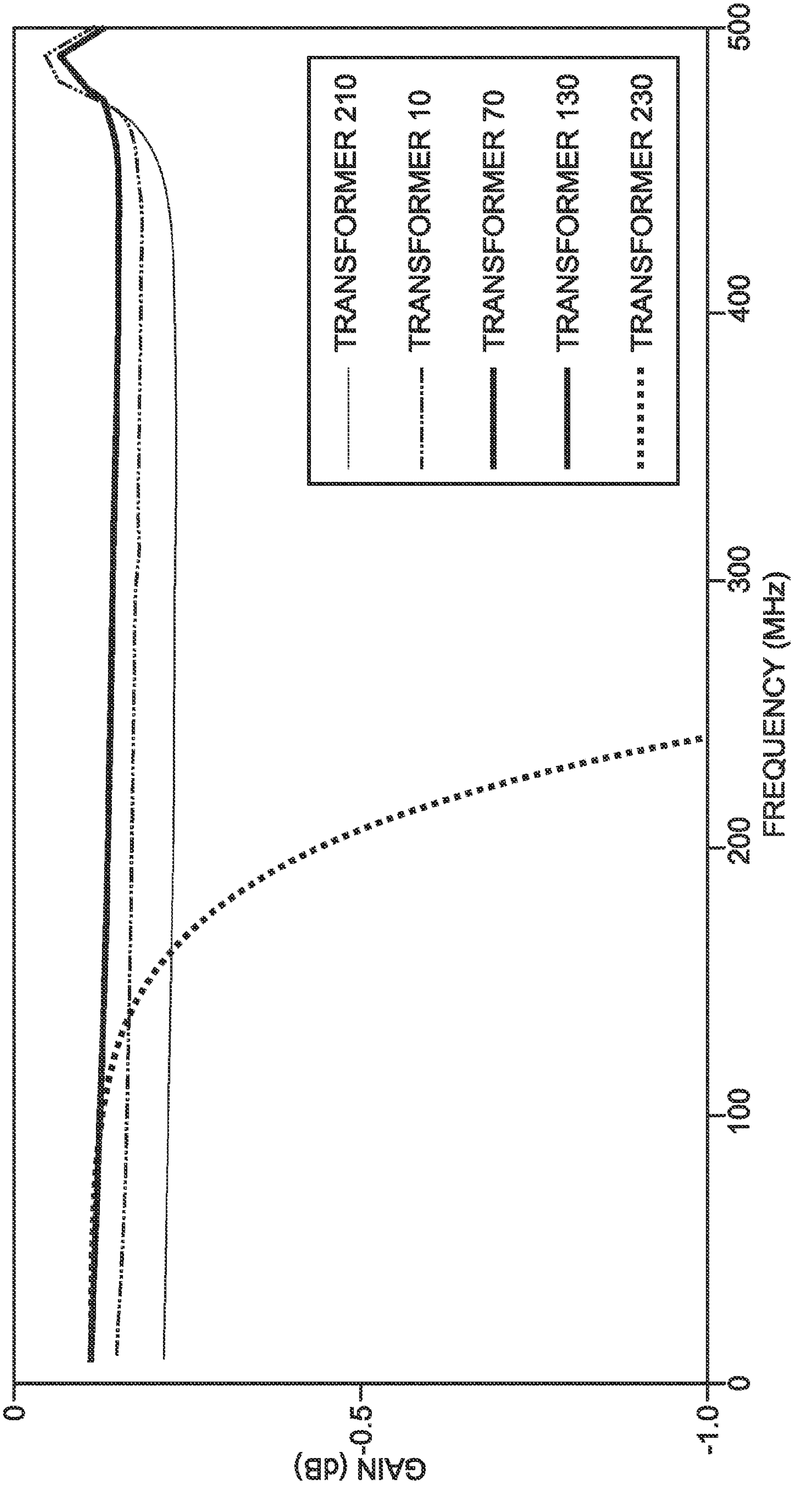
FIG. 8 is a chart illustrating an example of frequency responses for various transformers.

The simulated gain of some of the illustrated transmission-line transformers is shown in FIG. 8, as indicated in the legend. Gain, in decibels is shown over a frequency range of about 10 MHz to 500 MHz. It is seen that gain of transmission-line transformer 230 starts dropping off at about 120 MHz. The gain for transmission-line transformer 210 is less than that for transmission-line transformer 10. The highest gain is provided by transmission-line transformers 70 and 130, indicating improved performance over a broad frequency range.

The above description is intended to be illustrative of various embodiments of transmission-line transformers, and is not intended to be restrictive of the inventions contained in these examples. Many other embodiments will be apparent to those of skill in the art upon reviewing the above description. The scope of the inventions should, therefore, be determined with reference to the appended claims, along with the full scope of equivalents to which such claims are entitled. Accordingly, while embodiments of transmission-line transformers and methods of matching impedances have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed.

Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

INDUSTRIAL APPLICABILITY

The methods and apparatus described in the present disclosure are applicable to telecommunications systems, radar systems, and other systems utilizing radio-frequency circuits having impedances.

The invention claimed is:

1. A transmission-line transformer comprising:

a transmission-line assembly including first and second conductors forming at least first and second transmission-line sections, the first conductor having first and second ends and the second conductor having first and second ends, the second end of the first conductor being connected to the first end of the second conductor, and the second end of the second conductor being connected to a circuit ground, the transmission-line assembly forming a signal path between the first end of the first conductor and the circuit ground at the second end of the second conductor; and a balun assembly having first and second balanced lines and an unbalanced line, the first balanced line being connected to an intermediate point on the first conductor between the first and second transmission-line sections and the second balanced line being connected to an intermediate point on the second conductor between the first and second transmission-line sections;

the transmission-line transformer providing a signal path between the first end of the first conductor of the transmission-line assembly and the unbalanced line of the balun assembly.

2. The transmission-line transformer of claim 1, wherein the intermediate point on the second conductor is ungrounded.

3. The transmission-line transformer of claim 1, wherein the first and second transmission-line sections and the balun assembly have respective characteristic impedances, and the characteristic impedances of the transmission-line sections is different than the characteristic impedance of the balun assembly.

4. The transmission-line transformer of claim 1, further comprising a magnetic material extending around the combination of at least a portion of the second transmission-line section and at least a portion of the balun assembly.

5. The transmission-line transformer of claim 1, wherein the balun assembly includes third and fourth transmission-line sections connected electrically in parallel.

6. The transmission-line transformer of claim 1, wherein the balun assembly includes first and second baluns connected electrically in parallel.

7. The transmission-line transformer of claim 6, wherein the first and second transmission-line sections have a first characteristic impedance and the balun assembly has a second characteristic impedance that is different than the first characteristic impedance.

8. The transmission-line transformer of claim 1, wherein the balun assembly includes a third conductor inductively coupled to a portion of the second conductor in the second transmission-line section.

9. The transmission-line transformer of claim 8, wherein a portion of the first conductor in the second transmission-line section is on a first side of the portion of the second conductor in the second transmission-line section opposite from the third conductor.

10. The transmission-line transformer of claim 9, wherein the balun assembly further includes a fourth conductor inductively coupled to the third conductor, the fourth conductor having ends connected to corresponding ends of the portion of the second conductor in the second transmission-line section.

11. A transmission-line transformer comprising:

first, second and third coupled sections with each coupled section having first and second inductively coupled conductors, the first and second conductors of each coupled section each having a respective first end at a first end of the respective coupled section and a second end at a second end of the respective coupled section;

the first ends of the first conductors of the first, second and third coupled sections being connected together;

the first ends of the second conductors of the first, second and third coupled sections being connected together;

the second end of the second conductor of the first coupled section being connected to the second end of the first conductor of the second coupled section;

the second ends of the second conductors of the second and third coupled sections being connected to a circuit ground; and a signal being conducted through the transmission-line transformer between the second end of the first conductor of the first coupled section and the second end of the first conductor of the third coupled section.

12. The transmission-line transformer of claim 11, wherein the first ends of the second conductors are ungrounded.

13. The transmission-line transformer of claim 11, wherein the first, second, and third coupled sections have respective characteristic impedances, and the characteristic impedances of the first and second coupled sections are different than the characteristic impedance of the third coupled section.

14. The transmission-line transformer of claim 11, further comprising a magnetic material extending around the combination of at least a portion of each of the second and third coupled sections.

15. The transmission-line transformer of claim 11, further comprising a fourth coupled section connected electrically in parallel with the third coupled section.

16. The transmission-line transformer of claim 11, wherein the third and fourth coupled sections are coaxial transmission lines.

17. The transmission-line transformer of claim 15, wherein the first, second, third and fourth coupled sections have equal respective characteristic impedances.

18. The transmission-line transformer of claim 11, wherein the second conductor of the third coupled section is the second conductor of the second coupled section.

19. The transmission-line transformer of claim 18, wherein the first conductor in the second coupled section is on a first side of the second conductor in the second coupled section opposite from the first conductor in the third coupled section.

20. The transmission-line transformer of claim 19, further comprising a fourth coupled section, the first conductor of the third coupled section also being the first conductor of the fourth coupled section, the fourth coupled section also including a second conductor inductively coupled to the first conductor of the third coupled section and being disposed on a side of the first conductor of the third coupled section opposite the second conductor of the third coupled section.

* * * * *